US006207980B1

(12) United States Patent
Miyazaki et al.

(10) Patent No.: US 6,207,980 B1

(45) Date of Patent: Mar. 27, 2001

(54) LAYOUT METHOD OF A SEMICONDUCTOR DEVICE

(75) Inventors: Hiroshi Miyazaki; Kouji Tsunetou, both of Kasugai; Toru Osajima, Kawasaki, all of (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/241,847

(22) Filed: Feb. 2, 1999

(30) Foreign Application Priority Data

May 29, 1998 (JP) ........................................ 10-150293

(51) Int. Cl.[7] ........................................ H01L 27/10

(52) U.S. Cl. ........................................ 257/203; 257/773

(58) Field of Search ........................................ 257/203, 208, 257/773, 786

(56) References Cited

FOREIGN PATENT DOCUMENTS

2143990 * 2/1985 (GB) ........................................ 257/203

9-181183 7/1997 (JP) .

* cited by examiner

*Primary Examiner*—Mark V. Prenty

(74) *Attorney, Agent, or Firm*—Staas & Halsey LLP

(57) ABSTRACT

A semiconductor device includes multi-pin I/O buffers. The I/O buffers are located near an I/O pad area of the device. The multi-pin I/O buffers include multiple, generally L-shaped terminals that are connected to pads in the I/O pad area with wirings. The terminals of the I/O buffers include a horizontal terminal section and a vertical terminal section. The horizontal terminal sections extend in a width direction from a corner of the buffer toward a middle point of a side of the buffer, and the vertical terminal section extends in a length direction from the corner of the terminal toward a middle point of a side of the buffer. The wirings may also be generally L-shaped.

18 Claims, 5 Drawing Sheets

LAYOUT METHOD OF A SEMICONDUCTOR DEVICE

BACKGROUND OF THE INVENTION

The present invention generally relates to a layout method of a semiconductor device, and, more particularly, to an improved layout method of wirings for connecting pads and I/O (input/output) terminals of an I/O buffer in an ASIC (application specific integrated circuit), such as an E/A (embedded array) or a G/A (gate array).

In recent years, in line with large scale, high integration of semiconductor devices, the need to shorten the development period of semiconductor devices has grown. In particular, in ASIC devices, products that meet various specifications need to be developed in a short time using existing chip frames.

Referring to FIGS. 1 and 2, a conventional semiconductor device (LSI) 1 which uses an ASIC (semi-custom IC), such as an E/A and a G/A, is shown.

FIG. 1 is a schematic diagram of part of an existing (fixed or general-purpose) chip frame 2 of the LSI 1 and an LSI package 11. The chip frame 2 is equipped with an I/O region 4 and a pad region 7, each of which extends along a chip side 1*a*. I/O buffers 3 are arranged in the I/O region 4 and LSI I/O terminals (pads) 6 are arranged in the pad area 7. I/O terminals 8 are defined in the respective I/O buffers 3. The chip frame 2 is further equipped with inter-I/O-pad wirings 9 that connect the I/O terminals 8 and the pads 6. The pads 6 are then connected to lead frames 14 via bonding wires 15.

The I/O region 4 and the number of I/O buffers 3 are set to be fixed or generalized in accordance with the I/O frame information. The pad region 7, and the number of pads 6 and their positions are set to be fixed or generalized in accordance with the pad information. The patterns of the I/O terminals 8 and the patterns of the inter-I/O-pad wirings 9 are set to be fixed or generalized in accordance with wiring information.

The wiring information includes the information for forming the I/O terminals 8 in the I/O buffers 3 toward the pad region 7 along the chip side 1*a*. The wiring information also includes the information for forming the inter-I/O-pad wirings 9 between the pads 6 and the I/O terminals 8 in the substantially vertical direction for the chip side 1*a*.

In the LSI 1 equipped with the existing chip frame 2, each pattern is set to be fixed or generalized. Hence, the fixing or generalization of an evaluation board used in a characteristic evaluation test of the chip state is enabled. Accordingly, use of the existing chip frame 2 is effective for reducing the LSI development cost and shortening the LSI development and preparation period.

FIG. 2 is a schematic diagram of the semiconductor device in which the LSI 1 is installed in the LSI package 11. In FIG. 2, the chip side (top side) 1*a* is mainly described.

The number of pads 6 is automatically determined based on chip size, and the chip size is determined based on the circuit scale of an internal logic circuit 13. Accordingly, as shown in FIG. 2, if the number of required I/O buffers 3 is small irrespective of a relatively large chip size, a chip is installed in a package having less lead frames than the number of pads 6. In this case, there are non-connection (NC) pads 6*a* that are not connected to the lead frames 14 via bonding wires 15. Further, in terms of the layout of the pads 6 and the lead frames 14, the pads 6 are alternately connected to the lead frames 14 in the vicinity of the right and left ends of the chip side 1*a*.

Returning again to FIG. 1, the I/O buffers 3 include multi-pin I/O buffers 3*a*1 and 3*a*2 having a plurality (for example, two) I/O terminals 8.

For example, the 2-pin I/O buffer 3*a*1 arranged in region A is formed using two basic I/O frames 5. The 2-pin I/O buffer 3*a*2 arranged in region B is formed using three basic I/O frames 5. In other words, in region B, because the two I/O terminals 8 are connected to the two pads 6 on both sides of the NC pad 6*a*, respectively, three basic I/O frames 5 are required.

Accordingly, the pattern data of the two independent I/O buffers that correspond to the 2-pin I/O buffers 3*a*1 and 3*a*2 having the same functions and different physical patterns is stored in the data library of a layout device.

As described above, the existence of the NC pad 6*a* requires the pattern data of the 2-pin I/O buffers 3*a*1 and 3*a*2 having the same functions and different physical patterns. In other words, the two types of pattern data of the 2-pin I/O buffers 3*a*1 and 3*a*2 need to be prepared separately.

Further, a CAD system used to create the LSI 1 stores the pattern data of the 2-pin I/O buffers 3*a*1 and 3*a*2 in the library and reads and processes their pattern data from the library during the design stage. Accordingly, the processing time of the pattern data is prolonged. As a result, the manufacturing cost is increased and the development cycle is prolonged.

It is an object of the present invention to provide a layout method of a semiconductor device that reduces the manufacturing cost and shortens the development period.

SUMMARY OF THE INVENTION

Briefly stated, in a semiconductor device having a plurality of pads and a plurality of I/O buffers, the present invention provides a method of laying out inter-I/O-pad wirings between the pads and the I/O buffers. First, the plurality of I/O buffers are arranged in an I/O frame. The plurality of I/O buffers includes a two pin I/O buffer having two I/O terminals that corresponds to two of the plurality of pads. Then, the plurality of pads are arranged in a pad region near the I/O frame, the two I/O terminals that correspond to the two pads in the two pin I/O buffer are arranged. Each of the I/O terminals includes a generally horizontal terminal extending in the width direction of the two pin I/O buffer near the end of the two pin I/O buffer opposed to the pads and a vertical terminal extending in the lengthwise direction of the I/O buffer. Then, two inter-I/O-pad wirings are formed that extend toward and contact the two pads, respectively, from one of the horizontal terminals and the vertical terminals thereof in accordance with a spacing of the two pads, respectively.

The present invention provides a semiconductor device including a plurality of pads and a plurality of I/O buffers including two pin I/O buffers that correspond to two pads. A plurality of I/O terminals including two I/O terminals are arranged in the two pin I/O buffer corresponding to the two pads. Each of the two I/O terminals includes a horizontal terminal extending in the width direction of the two pin I/O buffer near the end of the two pin I/O buffer opposed to the pads and a vertical terminal extending in the lengthwise direction of the I/O buffer. A plurality of inter-I/O-pad wirings include two inter-I/O-pad wirings extending toward the pads from one of the horizontal terminals and the vertical terminals in accordance with a spacing of the two pads.

The present invention further provides a generally rectangular shaped multi-pin I/O buffer. The buffer includes a first I/O terminal located near a first corner of the buffer and a second I/O terminal located near a second corner of the buffer adjacent to the first corner. The first and second corners are on a side of the I/O buffer opposing a pad area of a semiconductor device. Each of the first and second I/O terminals includes a horizontal terminal section and a vertical terminal section. The horizontal terminal sections extend in a width direction from the corner in which the terminal is located toward a middle point of a side of the buffer. The vertical terminal section extend in a length direction from the corner in which the terminal is located toward a middle point of a side of the buffer.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
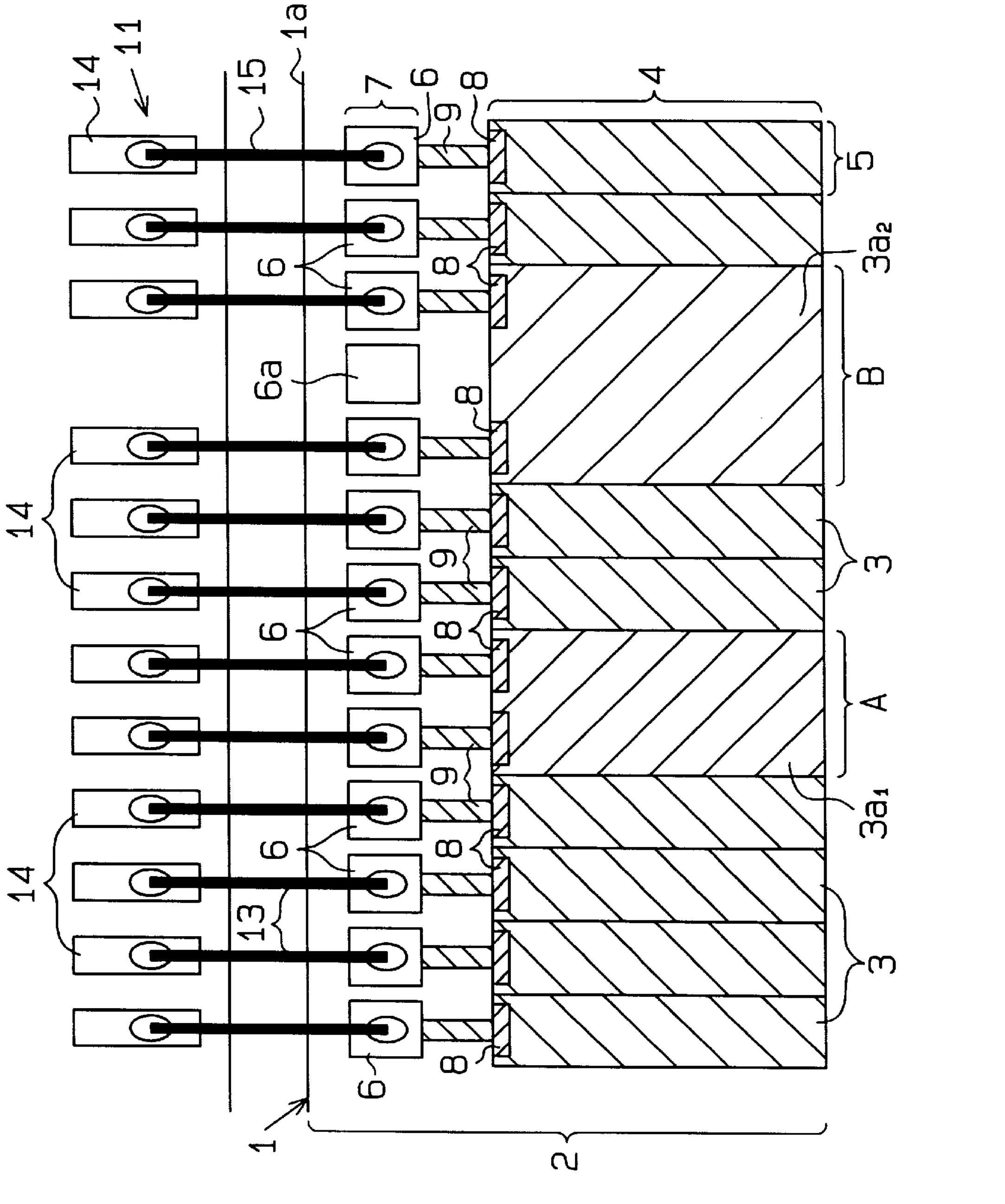
FIG. 1 is a schematic diagram of part of a conventional chip frame and an LSI package.

In the drawings, like numerals are used for like elements throughout.

One embodiment of the present invention is described below in accordance with FIGS. 3 to 5.

Figure 3:
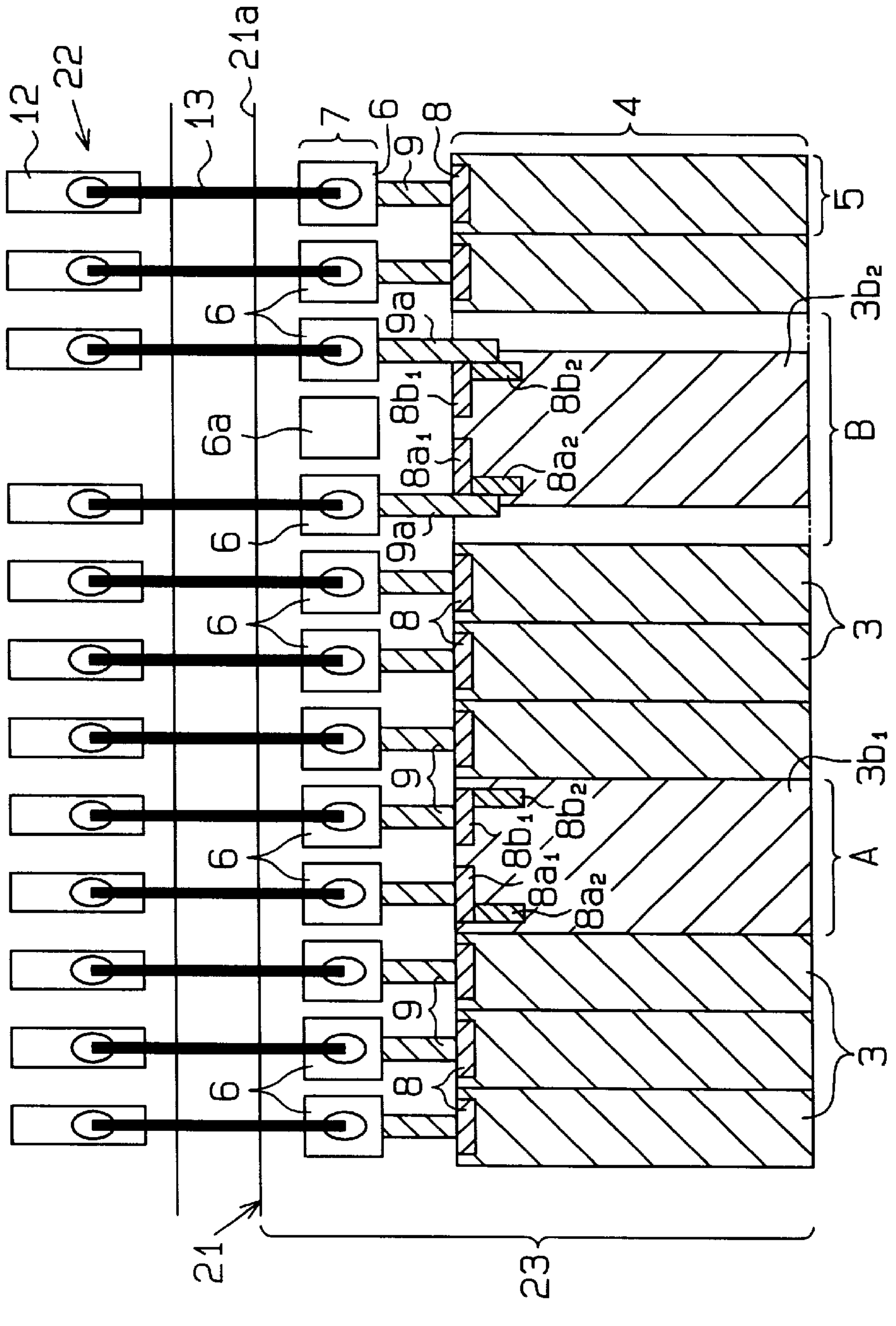
FIG. 3 is a schematic diagram of part of the conventional chip frame and LSI package according to a first embodiment of the present invention.

FIG. 3 is a schematic diagram of part of an existing chip frame 23 of LSI 21 and an LSI package 22. The chip frame 23 is equipped with the I/O region 4 as an I/O frame and the pad region 7 defined between a chip side 21*a* and the I/O region 4, each of which extends along the chip side 21*a*. I/O buffers 3 are arranged in the I/O region 4. The LSI I/O terminals (pads) 6 are arranged in the pad region 7 at constant intervals. I/O terminals 8, 8*a*, and 8*b* are defined in the respective I/O buffers 3. The chip frame 23 is further equipped with inter-I/O-pad wirings 9 and 9*a* that connect the I/O terminals 8, 8*a*, and 8*b* and the pads 6.

The I/O region 4 and the number of I/O buffers 3 are set to be fixed or generalized in accordance with the I/O frame information. The pad area 7, and the number of pads 6 and their positions are set to be fixed or generalized in accordance with the pad information. The patterns of the I/O terminals 8, 8*a*, and 8*b* and the patterns of the inter-I/O-pad wirings 9 and 9*a* are set to be fixed or generalized in accordance with the wiring information.

The wiring information includes the position and shape information of the I/O terminals 8 arranged in the 1-pin I/O buffer 3 and the position and shape information of the I/O terminals 8*a* and 8*b* arranged in the multi-pin I/O buffers 3*b*1 and 3*b*2. Specifically, the I/O terminals 8 are formed in parallel (in the width direction of the 1-pin I/O buffers 3) with the chip side 21*a* at the end of the 1-pin I/O buffers 3 opposed to the pad area 7.

Figure 2:
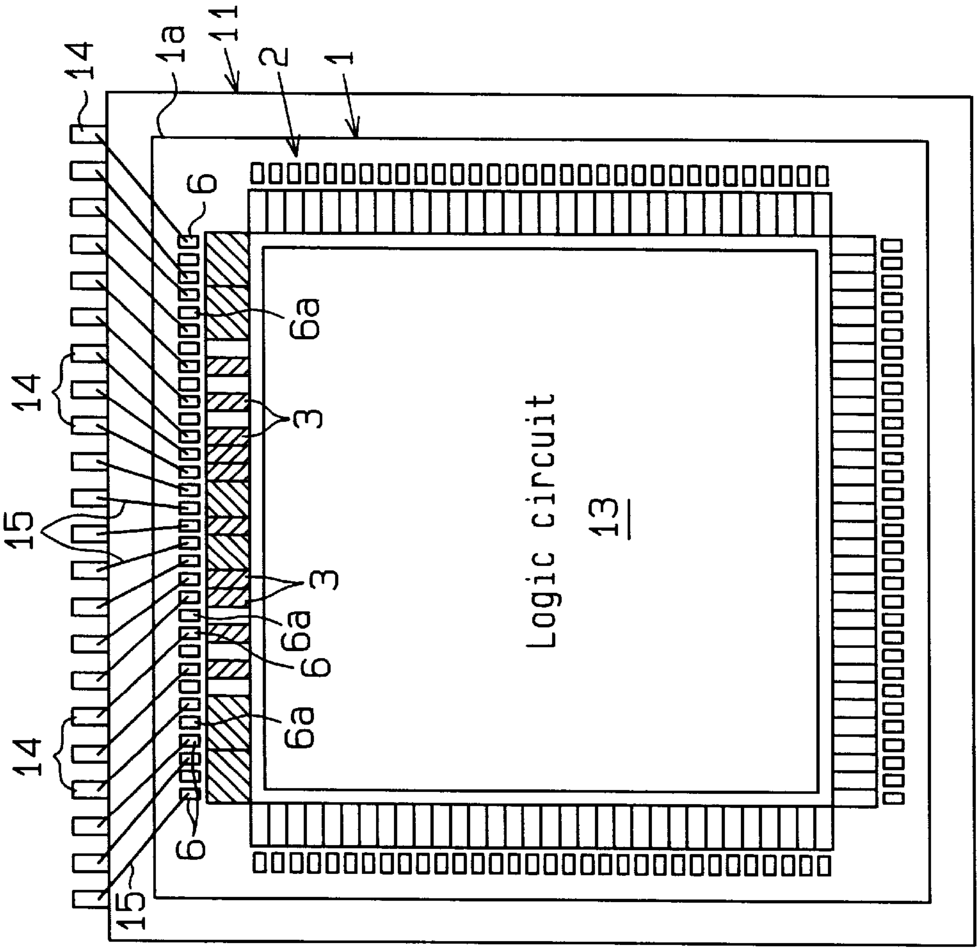
FIG. 2 is a schematic diagram of a semiconductor device using the conventional chip frame.
Figure 4:
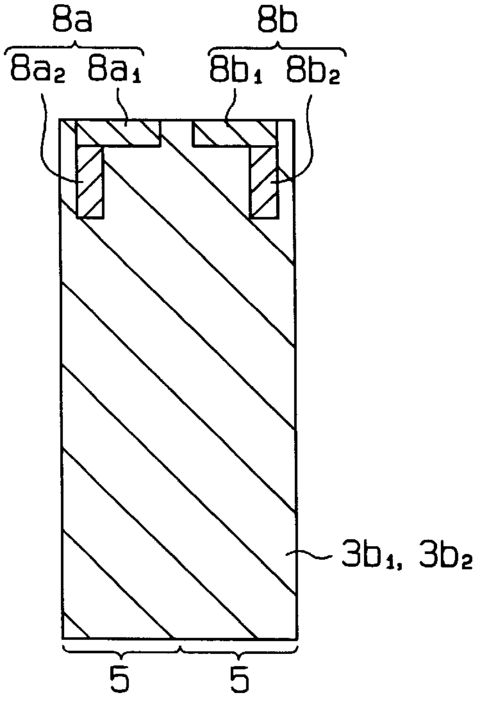
FIG. 4 is a schematic diagram of an I/O buffer in accordance with the present invention.
Figure 5:
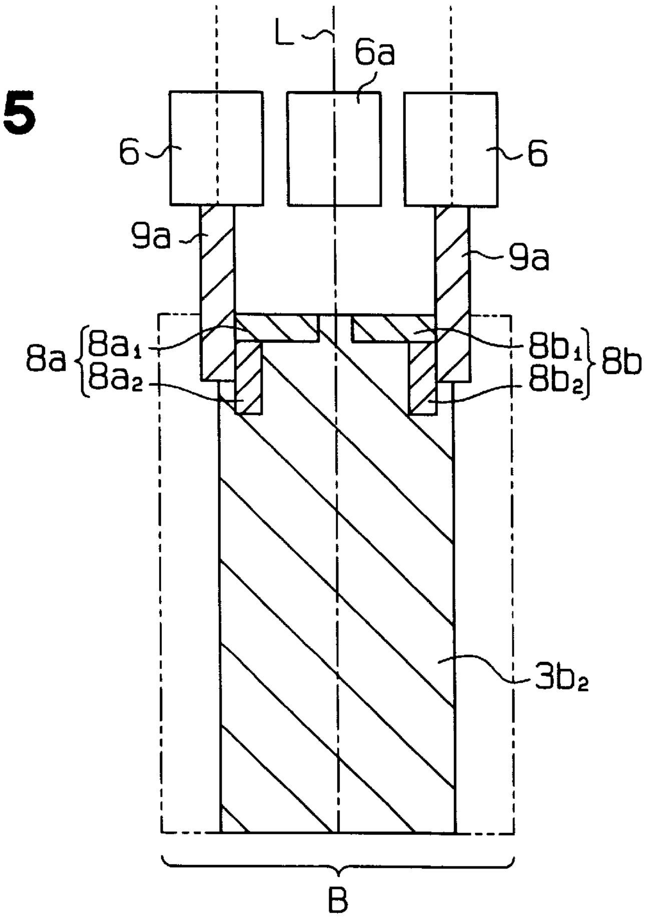
FIG. 5 is a schematic diagram of an I/O buffer, pads, and inter-I/O-pad wirings in accordance with the present invention.

Referring now also to FIGS. 4 and 5, 2-pin I/O buffers 3*b*1 and 3*b*2 are formed using the two basic I/O frames 5 (i.e. double I/O frames) regardless of regions A and B. The two I/O terminals 8*a* and 8*b* are formed inside the double I/O frames (i.e., region 4).

Each of the two I/O terminals 8*a* and 8*b* includes horizontal terminals 8*a*1 and 8*b*1 and vertical terminals 8*a*2 and 8*b*2. The horizontal terminals 8*a*1 and 8*b*1 are formed at or near the ends of the 2-pin I/O buffers 3*b*1 and 3*b*2 opposed to the pad region 7 and extend parallel (in the width direction of the 2-pin I/O buffer) with the chip side 21*a*. The vertical terminals 8*a*2 and 8*b*2 are formed on both of the sides of the 2-pin I/O buffers 3*b*1 and 3*b*2 and extend generally perpendicular (in the lengthwise direction of the 2-pin I/O buffers) to the chip side 21*a*. One of the ends of the horizontal terminals 8*a*1 and 8*b*1 and one of the ends of the vertical terminals 8*a*2 and 8*b*2 are connected, respectively. The horizontal terminals 8*a*1 and 8*b*1 and the vertical terminals 8*a*2 and 8*b*2 are symmetrically formed with respect to each other about a center line L extending in the lengthwise direction of the 2-pin I/O buffers 3*b*1 and 3*b*2.

The wiring information further includes shape information about the inter-I/O-pad wirings 9 and 9*a*. The shapes of the inter-I/O-pad wirings 9 and 9*a* differ depending on the relationships of the positions of the I/O terminals 8, 8*a*, and 8*b* to the pads 6. Specifically, when the center line of the pad 6 and a center of the I/O terminal 8, 8*a*1, or 8*b*1 are aligned, the inter-I/O-pad wiring 9 is formed between the I/O terminal 8, 8*a*1, or 8*b*1 and the pad 6 so as to extend along the center line.

If the center line of the pad 6 and the center of the I/O terminal 8, 8*a*1, or 8*b*1 are not aligned, the inter-I/O-pad wirings 9*a* are drawn in the horizontal direction from the vertical terminals 8*a*2 and 8*b*2 of the I/O terminals 8*a* and 8*b* and further formed so as to extend in the vertical direction toward the pads 6. That is, the inter-I/O-pad wiring 9*a* extends from at or near the center of the pad 6 to the near end of the I/O buffer 3*b*1, 3*b*2 and further extends along one end of the horizontal terminal 8*a*1, 8*b*1, and along one side of the vertical terminal 8*a* 2, 8*b*2. The two inter-I/O-pad wirings 9*a* are symmetrically formed with respect to each other about the center line of the I/O buffer 3*b*2.

FIG. 5 shows an example of the case where the pads 6 are arranged at constant intervals and the two I/O terminals 8*a* and 8*b* and the pads 6 located on the opposing sides of the non-connection (NC) pad 6*a*, are connected, respectively. In this layout, the inter-I/O-pad wirings 9*a* are formed so as to extend in the vertical direction toward the pads 6 from the vertical terminals 8*a*2 and 8*b*2. In other words, the inter-I/O pad wirings 9*a* are formed to make contact with the vertical terminals 8*a*2 and 8*b*2 and the horizontal terminals 8*a*1 and 8*b*1 on the side of the I/O buffer 3*b*2 and to extend in the lengthwise direction of the I/O buffer 3*b*2.

Figure 6:
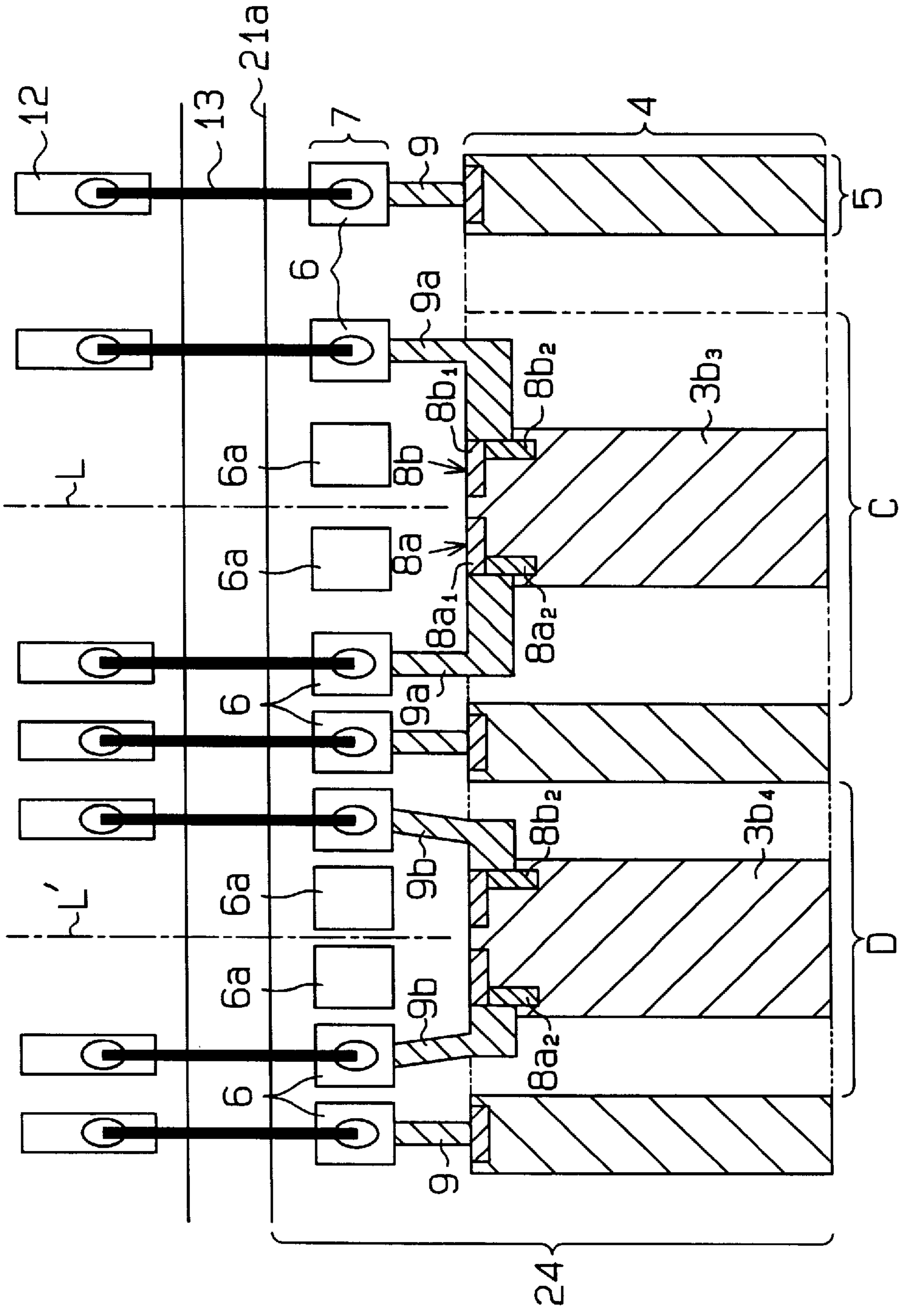
FIG. 6 is a schematic diagram of part of the chip frame and LSI package according to a second embodiment of the present invention.

FIG. 6 is a schematic diagram of part of a chip frame 24 and the LSI package 22 in which the pads 6 are arranged at irregular intervals. In the pad region 7 that corresponds to region C of the I/O frame 4, the two pads 6 connected to the I/O terminals 8*a* and 8*b* of a 2-pin I/O buffer 3*b*3 are arranged on both sides of the two NC pads 6*a*. The 2-pin I/O buffer 3*b*3 is arranged so that its center is aligned with the intermediate line L between the two connection pads 6. In this layout, the inter-I/O-pad wirings 9*a* are formed to extend in the horizontal direction from the vertical terminals 8*a*2 and 8*b*2, are bent halfway and then formed so as to extend in the vertical direction toward the pads 6. That is, the wirings 9*a* are L-shaped. The two wirings 9*a* are symmetrically arranged with respect to each other about the center line (intermediate line L) of the 2-pin I/O buffer 3*b*3.

In region D of the I/O frame 4, a 2-pin I/O buffer 3*b*4 is arranged so that its center is aligned with the intermediate line L between the two connection pads 6. In this case, inter-I/O-pad wirings 9*b* are formed so as to extend in the horizontal direction from the vertical terminals 8*a*2 and 8*b*2, are bent halfway and then formed so as to extend at a given angle of inclination toward the pads 6. The two wirings 9*a* are symmetrically arranged with respect to each other about the center line (intermediate line L) of the 2-pin I/O buffer 3*b*4.

The aforementioned layout processing is automatically performed using the information stored in the data library by the layout device.

For this embodiment, the vertical terminals 8*a*2 and 8*b*2 are formed to extend in the lengthwise direction of the 2-pin I/O buffers 3*b*1 to 3*b*4. Accordingly, the degree of design freedom of the wiring formed between the I/O terminals 8*a* and 8*b* and the pad 8 is increased. In other words, even if the NC pads 6a exist between the two connection pads 6, the wirings extending from the I/O terminals 8*a* and 8*b* of the 2-pin I/O terminal buffer to the connection pads 6 are easily formed. As a result, irrespective of the arrangement regions A, B, C, and D, the 2-pin I/O buffers 3*b*1 to 3*b*4 having the same function and the same physical patterns can be used. Accordingly, plural types of the 2-pin I/O buffers need not be prepared. As a result, the development cost of the LSI 21 is reduced and the development period of the LSI 21 is shortened.

Further, a CAD system used to perform the layout of the LSI 21 must hold the pattern data of only one type of the 2-pin I/O buffer in the library. Hence, the layout processing time using the pattern data is shortened.

Because the two inter-I/O-pad wirings 9, 9*a*, and 9*b* are symmetrically arranged, the wiring load between the I/O terminals 8*a* and 8*b* and the two connection pads 6 is substantially equal.

It should be apparent to those skilled in the art that the present invention may be embodied in many other specific forms without departing from the spirit or scope of the invention. Therefore, the present examples and embodiments are to be considered as illustrative and not restrictive and the invention is not to be limited to the details given herein, but may be modified within the scope and equivalence of the appended claims.

What is claimed is:

1. In a semiconductor device having a plurality of pads and a plurality of I/O buffers, a method of laying out inter-I/O-pad wirings between the pads and the I/O buffers comprising steps of:

arranging the plurality of I/O buffers in an I/O frame, wherein the plurality of I/O buffers includes a two pin I/O buffer having two I/O terminals that corresponds to two of the plurality of pads;

arranging the plurality of pads in a pad region near the I/O frame;

arranging the two I/O terminals that correspond to the two pads in the two pin I/O buffer, wherein each of the I/O terminals includes a generally horizontal terminal extending in the width direction of the two pin I/O buffer near the end of the two pin I/O buffer opposed to the pads and a vertical terminal extending in the lengthwise direction of the I/O buffer; and forming two inter-I/O-pad wirings extending toward and contacting the two pads, respectively, from one of the horizontal terminals and the vertical terminals thereof in accordance with a spacing of the two pads, respectively.

2. The layout method according to claim 1, wherein the step of arranging the two I/O terminals comprises the step of arranging the two I/O terminals in the two pin I/O buffers such that they are substantially symmetrical with respect to each other about an intermediate line between the two pads.

3. The layout method according to claim 2, wherein two inter-I/O-pad wirings are generally L-shaped such that the two inter-I/O-pad wirings extend substantially in the horizontal direction from the vertical terminal and extend in the vertical direction toward the two pads, respectively.

4. The layout method according to claim 3, wherein the two pin I/O buffers are about twice as large as a basic I/O buffer.

5. The layout method according to claim 3, wherein a vertical leg of each of the L-shaped wirings extends as a given angle of inclination that is greater than 90° from a horizontal leg thereof to the pad.

6. The layout method according to claim 5, wherein the two pin I/O buffers are about twice as large as a basic I/O buffer.

7. The layout method according to claim 3, wherein the two inter-I/O-pad wirings have a horizontal leg extending in the horizontal direction from the vertical terminals and a vertical leg extending in the vertical direction toward the two pads, wherein the horizontal leg and the vertical leg are approximately the same length.

8. The layout method according to claim 1, wherein the step of arranging the two I/O terminals comprises the step of arranging the two I/O terminals in the two pin I/O buffers such that they are substantially symmetrical about an intermediate line between the two pads.

9. A semiconductor device, comprising:

a plurality of pads;

a plurality of I/O buffers including two pin I/O buffers that correspond to two pads;

a plurality of I/O terminals including two I/O terminals arranged in the two pin I/O buffer corresponding to the two pads, wherein each of the two I/O terminals includes a horizontal terminal extending in the width direction of the two pin I/O buffer near the end of the two pin I/O buffer opposed to the pads and a vertical terminal extending in the lengthwise direction of the I/O buffer; and a plurality of inter-I/O-pad wirings including two inter-I/O-pad wirings extending toward the pads from one of the horizontal terminals and the vertical terminals in accordance with a spacing of the two pads.

10. The semiconductor device according to claim 9, wherein the two I/O terminals are arranged in the two pin I/O buffers such that they are substantially symmetrical about an intermediate line between the two pads, and wherein the two inter-I/O-pad wirings are substantially symmetrically arranged about the intermediate line and extend from the vertical terminals in the horizontal direction and then in the vertical direction toward the two pads, respectively.

11. The semiconductor device according to claim 9, wherein the two I/O terminals are arranged in the two pin I/O buffers such that they are substantially symmetrical about the intermediate line between the two pads, and wherein the two inter-I/O pad wirings are substantially symmetrically arranged about the intermediate line with respect to each other and extend from the vertical terminals in the horizontal direction and in the vertical direction at given angle of inclination greater than 90° toward the two pads, respectively.

12. A generally rectangular shaped multi-pin I/O buffer, comprising:

a first I/O terminal located near a first corner of the buffer; and a second I/O terminal located near a second corner of the buffer adjacent to the first corner, wherein the first and second corners are on a side of the I/O buffer opposing a pad area of a semiconductor device, wherein each of the first and second I/O terminals includes a horizontal terminal section and a vertical terminal section, the horizontal terminal sections extending in a width direction from the corner in which the terminal is located toward a middle point of a side of the buffer, and the vertical terminal section extending in a length direction from the corner in which the terminal is located toward a middle point of a side of the buffer.

13. The I/O buffer of claim 12, wherein the first and second I/O terminals are formed substantially symmetrically with respect to each other about a center line bisecting the I/O buffer in a lengthwise direction.

14. The I/O buffer of claim 12, wherein the I/O terminals are connected to respective pads in the pad area of the semiconductor device with first and second wirings, respectively.

15. The I/O buffer of claim 14, wherein the first and second wirings are generally L-shaped, having a first, horizontal leg extending in a horizontal direction from the I/O terminals and a second, vertical leg, extending from the horizontal leg to the pads.

16. The I/O buffer of claim 15, wherein the first and second legs are of substantially equal length.

17. The I/O buffer of claim 15, wherein the second leg of each of the wirings extends is generally perpendicular to its first leg.

18. The I/O buffer of claim 15, wherein the second leg of each of the wirings extends from the first leg at an angle of inclination that is greater than 90° degrees.

* * * * *